US 11,128,118 B2

(12) United States Patent
Rauwolf et al.

(10) Patent No.: US 11,128,118 B2
(45) Date of Patent: Sep. 21, 2021

(54) SOLID STATE POWER CONTROLLER

(71) Applicant: HS ELEKTRONIK SYSTEME GMBH, Nordlingen (DE)

(72) Inventors: Thomas Rauwolf, Noerdlingen (DE); Matthias Maier, Wallerstein (DE)

(73) Assignee: HS ELEKTRONIK SYSTEME GMBH, Nordlingen (DE)

(*) Notice: Subject to any disclaimer, the term of this patent is extended or adjusted under 35 U.S.C. 154(b) by 95 days.

(21) Appl. No.: 16/564,094

(22) Filed: Sep. 9, 2019

(65) Prior Publication Data
US 2020/0091700 A1 Mar. 19, 2020

(30) Foreign Application Priority Data
Sep. 14, 2018 (EP) .................... 18194588

(51) Int. Cl.
H02H 3/08 (2006.01)
H02H 9/02 (2006.01)
H02H 3/02 (2006.01)
B64D 41/00 (2006.01)
H02H 1/00 (2006.01)
H02H 9/04 (2006.01)

(52) U.S. Cl.
CPC ............ *H02H 3/025* (2013.01); *B64D 41/00* (2013.01); *H02H 1/0007* (2013.01); *H02H 3/08* (2013.01); *H02H 9/04* (2013.01); *B64D 2221/00* (2013.01)

(58) Field of Classification Search
CPC ...... B64D 2221/00; H02H 3/08; H02H 3/025; H02H 9/04
USPC ........................................................ 361/93.1
See application file for complete search history.

(56) References Cited

U.S. PATENT DOCUMENTS

| 4,174,496 | A | 11/1979 | Anderson et al. |
| 7,656,634 | B2* | 2/2010 | Robertson .......... H03K 17/0822 361/93.7 |
| 8,218,281 | B2 | 7/2012 | Vandergrift |
| 8,861,162 | B2 | 10/2014 | Fuller et al. |

(Continued)

FOREIGN PATENT DOCUMENTS

EP 2254246 A1 11/2010

OTHER PUBLICATIONS

Extended European Search Report for International Application No. 18194588.2 dated Mar. 15, 2019, 9 pages.

(Continued)

*Primary Examiner* — Jared Fureman
*Assistant Examiner* — Lucy M Thomas
(74) *Attorney, Agent, or Firm* — Cantor Colburn LLP

(57) ABSTRACT

A solid state power controller includes at least one solid state switching device connected to at least one load to be supplied with power from a power feed line and configured to selectively connect the respective load to the power feed line or to disconnect the respective load from the power feed line; at least one SSPC control circuit configured to supply a control voltage to a control terminal of the solid state switching device; and a discrete output circuit electrically that supplies a discrete output signal indicative of the state of the control terminal of the solid state switching device and the discrete output circuit detects an overcurrent in a circuit connected to the discrete output terminal and to limit an output current and/or interrupt supply of the discrete output signal in case an overcurrent is detected.

13 Claims, 2 Drawing Sheets

(56) References Cited

U.S. PATENT DOCUMENTS

| | | |
|---|---|---|
| 9,407,264 B1 | 8/2016 | Ali et al. |
| 9,702,910 B2 | 7/2017 | Baldridge |
| 2002/0176215 A1* | 11/2002 | Hiyama ............. H03K 17/0828 |
| | | 361/93.1 |
| 2015/0057822 A1 | 2/2015 | Baldridge |

OTHER PUBLICATIONS

Vishwas Vaidya: "Simple Current Limiter Protects Open-Collector Circuit", Nov. 10, 2010. 1 page.

* cited by examiner

SOLID STATE POWER CONTROLLER

FOREIGN PRIORITY

This application claims priority to European Patent Application No. 18194588.2 filed Sep. 14, 2018, the entire contents of which is incorporated herein by reference.

FIELD

Embodiments of the invention relate to a solid state power controller (SSPC), and more particularly to a solid state power controller comprising a self-locking discrete output. Such solid state power controller is particularly employed for distributing power to various electric loads in a vehicle, e.g. in an aircraft.

BACKGROUND

Typically, in a vehicle like an aircraft loads need to be supplied by different voltage levels or type of voltages. Every individual load requires its own power supply to connect the feeder voltage supplied by a power source in the vehicle to the load. In combination with solid state power converters switching power to these loads, a plurality of solid state power controllers (SSPCs) are used to switch the feeder voltage to the loads as needed. Each load is connected to the feeder voltage via its own SSPC associated to that load. Each SSPC comprises at least one, normally a plurality of, SSPC channels connected in parallel to the power feed line with each SSPC channel having an interface for connecting to the respective load. The plurality of SSPC channels is fed by a same power source via the power feed line. Often a plurality of SSPCs are combined in a solid state power module.

Typically, an SSPC (or an SSPC channel) is required to have an auxiliary output or contact for providing the functionality of a discrete output. Such discrete output is used to deliver an output signal indicative of the state of the SSPC or SSPC channel, e.g. whether the SSPC or SSPC channel is in an open state in which the respective load is disconnected from the feeder voltage (OFF condition), or whether the SSPC or SSPC channel is in a closed state in which the respective load is connected to the feeder voltage (ON condition). It is desirable that the discrete output is galvanically isolated from the SSPC. Provision of a galvanically isolated discrete output has hitherto been achieved by electromechanical contactors.

It would be beneficial to provide a more efficient solid state power controller comprising a galvanically isolated discrete output.

SUMMARY

Embodiments of the invention provide a solid state power controller (SSPC), comprising at least one solid state switching device (SSSD) connected to at least one load to be supplied with power from a power feed line and configured to selectively connect the respective load to the power feed line or to disconnect the respective load from the power feed line. The SSPC comprises at least one SSPC control circuit configured to supply a control voltage to a control terminal of the solid state switching device; and a discrete output circuit electrically connected to, and galvanically isolated from, the SSPC control circuit and/or the control terminal of the solid state switching device. The discrete output circuit comprises a discrete output terminal and is configured to supply at the discrete output terminal a discrete output signal indicative of the state of the control terminal of the solid state switching device. The discrete output circuit is configured to detect an overcurrent in a circuit connected to the discrete output terminal and to limit an output current and/or interrupt supply of the discrete output signal in case an overcurrent is detected.

The SSPC may comprise at least one SSPC channel, normally a plurality of SSPC channels, connected in parallel to the power feed line with each SSPC channel having an interface for connecting to the respective load. In the present disclosure, for sake of simplicity the term "SSPC" is used with respect to any configuration of an SSPC. It is to be understood that in an SSPC with a plurality of SSPC channels the term SSPC may refer to each of the SSPC channels, in particular each of the SSPC channels may have its own discrete output circuit. In some embodiments, a plurality of SSPC channels may share a common discrete output circuit. Then, the term SSPC refers to the SSPC channels sharing a discrete output circuit. Each SSPC channel comprises at least one solid state switching device and at least one SSPC control circuit.

The discrete output circuit delivers at the discrete output terminal a signal which may be used for indicating the status of the SSPC or SSPC channel controlled by the SSPC control circuit, e.g. optically by connecting an LED or other signal device to the discrete output terminal, or by connecting a control board or similar device to the discrete output terminal. The signal delivered at the discrete output terminal may also be used to control operation of further devices. In such cases, the discrete output terminal may be connected to a more complex electrical circuit supplying the discrete output signal. Any devices or electrical circuits connected to the discrete output terminal form a discrete output signal supplying circuit. Anomalous conditions, in particular overcurrent and/or overvoltage (in the following any anomalous situations of this kind will be simply referred to as "overcurrent") may occur in the discrete output supplying circuit and lead to dangerous situations. Therefore, it is desired that the SSPC is able to detect whether such overcurrent occurs in the discrete output supplying circuit and reacts accordingly (normally by limiting the output current and/or terminating supply of the discrete output signal, at least in case the overcurrent is detected for longer than a threshold time).

According to embodiments described herein the discrete output circuit is configured to detect overcurrent in the discrete output supplying circuit and limit the output current and/or interrupt supply of the discrete output signal in case an overcurrent is detected. No interaction is required between the discrete output circuit and the SSPC or SSPC control circuit for detecting overcurrent in the discrete output supplying circuit and limiting the output current and/or interrupting supply of the discrete output signal. Rather, the discrete output circuit is configured to lock itself autonomously in case of overcurrent. Detection of overcurrent as well limiting the output current and/or interruption of supply of the discrete output signal is independent of the state of the control terminal of the solid state switching device of the SSPC. Limiting the output current and/or interruption of supply of the discrete output signal does not affect the state of the control terminal of the solid state switching device of the SSPC. In particular, a control terminal voltage of the at least one solid state switching device of the SSPC remains unaffected by limiting the output current and/or interrupting supply of the discrete output signal by the discrete output circuit.

Particularly, the discrete output circuit is triggered by the SSPC or SSPC control circuit to supply the discrete output signal when the SSPC is switched from an open state in which the load is disconnected from the power feed line (OFF condition) to a closed state in which the load is connected to the power feed line (ON condition). Upon receipt of a signal indicating that the SSPC is switched from an open state (OFF condition) to a closed state (ON condition), the discrete output circuit is configured to switch itself to ON, i.e., to supply the discrete output signal. The discrete output circuit is also configured to lock itself in case an overcurrent is detected in the discrete output supplying circuit. Once having locked itself, the discrete output circuit is configured to limit the output current and/or to no longer supply the discrete output signal irrespective whether the SSPC remains in a closed state or switches to an open state, particularly in case the overcurrent is detected for longer time. The discrete output circuit may be triggered to again supply the discrete output signal in case it receives a subsequent signal from the SSPC over the galvanically isolated connection indicating that the SSPC is switched from the open state to a closed state again.

The self-locking capability of the discrete output circuit allows to avoid exchange of signals between the discrete output circuit and the SSPC or SSPC control circuit which are connected with each other in galvanically isolated manner. Only one trigger signal is required for triggering the discrete output circuit to supply the discrete output signal when the SSPC is switched from the open state (OFF condition) to a closed state (ON condition). This reduces consumption of circuit board space, since multiple exchange of signals over the galvanically isolated connection is not required.

A galvanically isolated electrical connection between the SSPC control circuit and/or the control terminal of the solid state switching device and the discrete output circuit may be realized by any known techniques, e.g. using opto-couplers, inductive coupling devices, capacitive coupling devices, or any other coupling circuits like DC-DC converters.

In particular, the SSPC described herein may be used in a power distribution system configured for managing and distributing electric power in an aircraft. Embodiments also provide an aircraft comprising such power distribution system.

Particular embodiments may include any of the following optional features, alone or in combination with other features:

The discrete output circuit may comprise a discrete input terminal connected in a galvanically isolated manner to a control circuit output of the SSPC control circuit. In this way a control voltage for switching the solid state switching device of the SSPC may be received by the discrete input terminal and used to trigger supply of the discrete output signal in case the control voltage is switched from OFF (open state of the SSPC) to ON (closed state of the SSPC).

Further, the discrete output circuit may comprise a discrete output switch connected to the discrete output terminal, the discrete output switch being configured to supply the discrete output signal at the discrete output terminal when switched to a closed state. The discrete output switch may have a discrete output switch control terminal connected to the discrete input terminal of the discrete output circuit and thus receiving the trigger signal for supplying the discrete output signal. In principle, the control terminal of the discrete output switch may be connected directly to the discrete input terminal. In most embodiments, the control terminal of the discrete output switch may be connected to a control terminal driver circuit which itself is triggered by the signal supplied to the discrete input terminal, as described in more detail below.

The discrete output switch may be a solid state switching device, in particular a transistor like an IGBT or a field effect transistor like a MOSFET or a JFET. In case of a field effect transistor, the control terminal of the discrete output switch is a gate terminal, and the discrete output signal is supplied in a drain-source circuit of the field effect transistor in case the field effect transistor is switched to an ON condition (i.e. the drain-source path is electrically conductive) by applying a corresponding control voltage to the gate terminal.

Further, the discrete output circuit may comprise a first overcurrent limiting circuit configured to reduce a control voltage applied to the control terminal of the discrete output switch such as to increase an output resistance provided at the discrete output terminal according to an increase of an output current in a circuit connected to the discrete output terminal of the discrete output circuit (also referred to as a discrete output signal supplying circuit). The first overcurrent limiting circuit may comprise a feedback loop for feeding back a signal indicative of the output current to the control terminal of the discrete output switch. The feedback loop may be configured to be inactive as long as the output current remains below a feedback loop activation threshold. The feedback loop may further be configured in a manner that after activation of the feedback loop an increase in the output current will lead to an increase of an output resistance at the discrete output terminal.

The first overcurrent limiting circuit may be configured to operate the discrete output switch in a linear mode after activation of the feedback loop, i.e. in case the output current increases to or above a feedback loop activation threshold. Particularly, the feedback loop may be configured to shift the operating mode of the discrete output switch from an ohmic mode to a linear mode after activation of the feedback loop. When operated in the linear mode the discrete output switch provides an output resistance which depends on the state of the discrete output switch control terminal. As one example, in case the discrete output switch is a field effect transistor, when the field effect transistor is operated in a linear mode the output resistance of the drain-source path will depend on the control voltage supplied to the gate terminal (the lower the control voltage supplied to the gate terminal, the higher the output resistance in the drain-source path). Analog considerations apply in case the discrete output switch is a transistor. Once activated, the feedback loop of the first overcurrent limiting circuit may thus affect the control voltage supplied to the control terminal of the discrete output switch in such a way that an increase in the output current causes a decrease in the control voltage supplied to the control terminal of the discrete output switch, thus increasing the output resistance of the discrete output circuit.

Particularly, the first overcurrent limiting circuit may comprise a current stabilizing transistor having a base connected to the discrete output signal supplying circuit, a collector connected to the control terminal of the discrete output switch, and an emitter connected to ground. The feedback loop comprises the current stabilizing transistor which is connected in such a manner that a base-emitter voltage of the current stabilizing transistor increases with increasing output current in the discrete output signal supplying circuit. Once the base-emitter voltage increases to a threshold voltage or above, the current stabilizing transistor becomes conductive. This activates the feedback loop of the first overcurrent limiting circuit. In the activated state, the output current in the discrete output signal supplying circuit causes a base-emitter current in the current stabilizing transistor. The base-emitter current leads to an amplified current in the collector-emitter circuit of the current stabilizing transistor. Thereby, an increase in output current in the discrete output signal supplying circuit will cause a decreasing electric resistance in the collector-emitter circuit. In this way the current stabilizing transistor will reduce the control voltage supplied to the control terminal of the discrete output switch in accordance with an increase in the output current flowing in the discrete output signal supplying circuit. The reduction of the control voltage also causes that the discrete output switch is operated in a linear mode (e.g. in the form of a MOSFET or FET operated in linear mode) after activation of the feedback loop of the first overcurrent limiting circuit. In the linear mode output resistance of the discrete output switch will increase in accordance with decrease in the control voltage supplied to the control terminal of the discrete output switch. Increased output resistance will reduce the output current in the discrete output signal supplying circuit. Thus, once the output current in the discrete output limiting circuit reaches a predefined feedback loop activation threshold, the feedback loop of the first overcurrent limiting circuit is activated and stabilizes the output current in the discrete output signal supplying circuit.

Further, the discrete output circuit may include a latch circuit connected in between the discrete input terminal and the control terminal of the discrete output switch. The latch circuit may have any configuration known in the art. Particularly, when a triggering signal is provided to an input terminal of the latch circuit, the latch circuit will switch an output terminal thereof to HIGH and provide the HIGH signal at the output terminal, until a reset signal is received at a reset terminal of the latch circuit. Connecting the input terminal of the latch circuit to the discrete input terminal will thus allow to switch the latch circuit to HIGH and provide a signal indicating the HIGH condition at the output terminal of the latch circuit. The output terminal of the latch circuit may be connected directly to the control terminal of the discrete output switch. Alternatively, the discrete output circuit may comprise a control terminal driver connected in between the out terminal of the latch circuit and the control terminal of the discrete output switch. The control terminal driver may have the configuration of an operating amplifier providing a suitable control voltage for switching the discrete output switch from an open state to a closed state, if desired to a closed state in which the discrete output switch operates in a linear mode.

Further, the discrete output circuit may comprise a second overcurrent limiting circuit configured to detect an overcurrent in a circuit connected to the discrete output terminal, i.e., any anomalous situations being detectable as an overcurrent and/or an overvoltage in the circuit connected to the discrete output terminal (also referred to as a discrete output signal supplying circuit). Overcurrent/overvoltage refers to a current/voltage exceeding a predefined threshold level.

The second overcurrent limiting circuit may comprise a comparator having a first input receiving a signal according to a current and/or voltage in the circuit connected to the discrete output terminal, and a second terminal supplied by a reference signal. The reference signal indicates a predefined overcurrent detection threshold. In case the current and/or voltage measured in the circuit connected to the discrete output terminal reaches or exceeds the overcurrent detection threshold, the comparator detects an overcurrent condition and supplies a comparator overcurrent signal at an output thereof.

The second overcurrent limitation circuit further may comprise an AND logic having a first input connected to the output of the comparator, a second input connected to the discrete input terminal, and an output connected to a reset input of the latch circuit. The AND logic provides an AND logic overcurrent signal at its output in case it receives a comparator overcurrent signal from the comparator at its first input and a control voltage corresponding to an ON condition of the solid state switching device of the SSPC at its second input terminal. As the output of the AND logic is connected to a reset input of the latch circuit, the latch circuit is reset (cleared) in case the AND logic provides the AND logic overcurrent signal at its output. Resetting (clearing) the latch circuit will set the output terminal of the latch circuit to LOW and thereby switch the discrete output switch to the OFF condition (in which the source drain path of the discrete output switch is electrically interrupted). Once the discrete output switch is switched to the OFF signal the discrete output is no longer supplied at the discrete output terminal.

The second overcurrent limiting circuit further may comprise a first RC member connected in between the output of the comparator and the first input of the AND logic. The first RC member may delay supply of the comparator overcurrent signal from the comparator output to the first input of the AND logic with respect to occurrence of a difference at the comparator input between the current signal in the discrete output signal supplying circuit and the reference signal indicating the predefined overcurrent detection threshold. Thus, the resetting (clearing) of the latch circuit may be delayed with respect to detection of an overcurrent by the comparator for a predefined time which can be adjusted by the capacity and resistance of the first RC member. Activation of the second overcurrent limiting circuit in case of an overcurrent can be delayed by the first RC member with respect to the time the overcurrent occurs. Therefore, in case of an overcurrent condition in the discrete output signal supplying circuit, as a primary measure the first overcurrent limiting circuit may be activated when an overcurrent exceeds the feedback loop activation threshold. Activation of the feedback loop of the first overcurrent limiting circuit will lead to operation of the discrete output switch in the linear mode and stabilization of the output current. As the discrete output switch will be subject to significant power consumption when operated in the linear mode, it is desirable to limit operation of the discrete output switch in the linear mode to a certain time period. This can be achieved by activating the second overcurrent limiting circuit some time after activating the feedback loop of the first overcurrent limiting circuit, in order to switch off the discrete output switch and thus stop output of the discrete output signal. The delay between activation of the feedback loop of the first overcurrent limiting circuit and activation of the second current limiting circuit can be adjusted by selection of the first RC member. A typical delay caused by the first RC member is 10 ms. In this case the first current limiting circuit may cause operation of the discrete output switch in the linear mode for stabilizing the output current for about 10 ms. After 10 ms the second current limiting member will be activated and thus switch off the discrete output switch and interrupt the discrete output signal.

The feedback loop activation threshold for activating the first overcurrent limiting circuit and the overcurrent detection threshold of the second overcurrent limiting circuit may be set to a same value. It is also convenient to set the overcurrent detection threshold of the second overcurrent limiting circuit to lower value than the feedback loop detection threshold to make sure the second overcurrent limiting circuit will stop operation of the discrete output switch in the linear mode after a predefined time. Further the second overcurrent limiting circuit is able to detect high output currents being larger than a normal operating range of the discrete output circuit, but lower than the feedback loop activation threshold of the first overcurrent limiting circuit.

Activating the second overcurrent limiting circuit with a predefined delay, particularly as adjusted by the first RC member, also has the advantage that output of the discrete output signal is only interrupted in case an overcurrent extends for longer than a predefined time. Short overcurrent events, e.g. output current spikes, will not cause an interruption of the discrete output signal, in case these overcurrent events are terminated before lapse of the predefined delay. If required, such short overcurrents will be limited by the first overcurrent limiting circuit.

Further, the discrete output circuit may comprise a second RC member connected in between the discrete input terminal and an enable/CLK input of the latch circuit. The second RC member may delay supply of a CLK signal to the latch circuit to ensure that the control voltage supplied to the first input terminal of the latch circuit is already present for some time (typically a few microseconds) when supplying the CLK signal to change the state of the latch circuit from OFF to ON.

BRIEF DESCRIPTION OF THE FIGURES

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
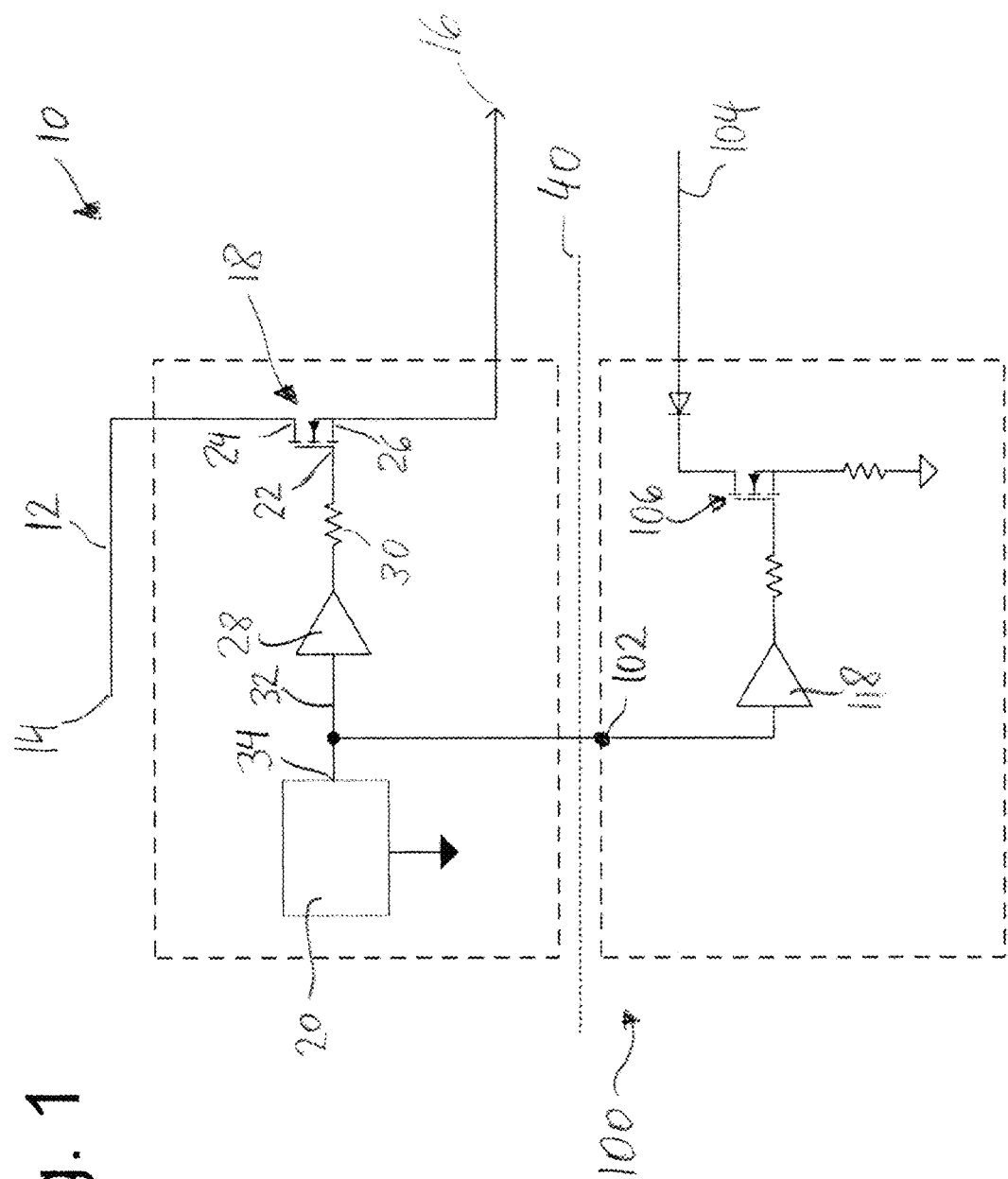
FIG. 1 illustrates a simplified block diagram of a solid state power controller (SSPC) including a discrete output circuit.
Figure 2:
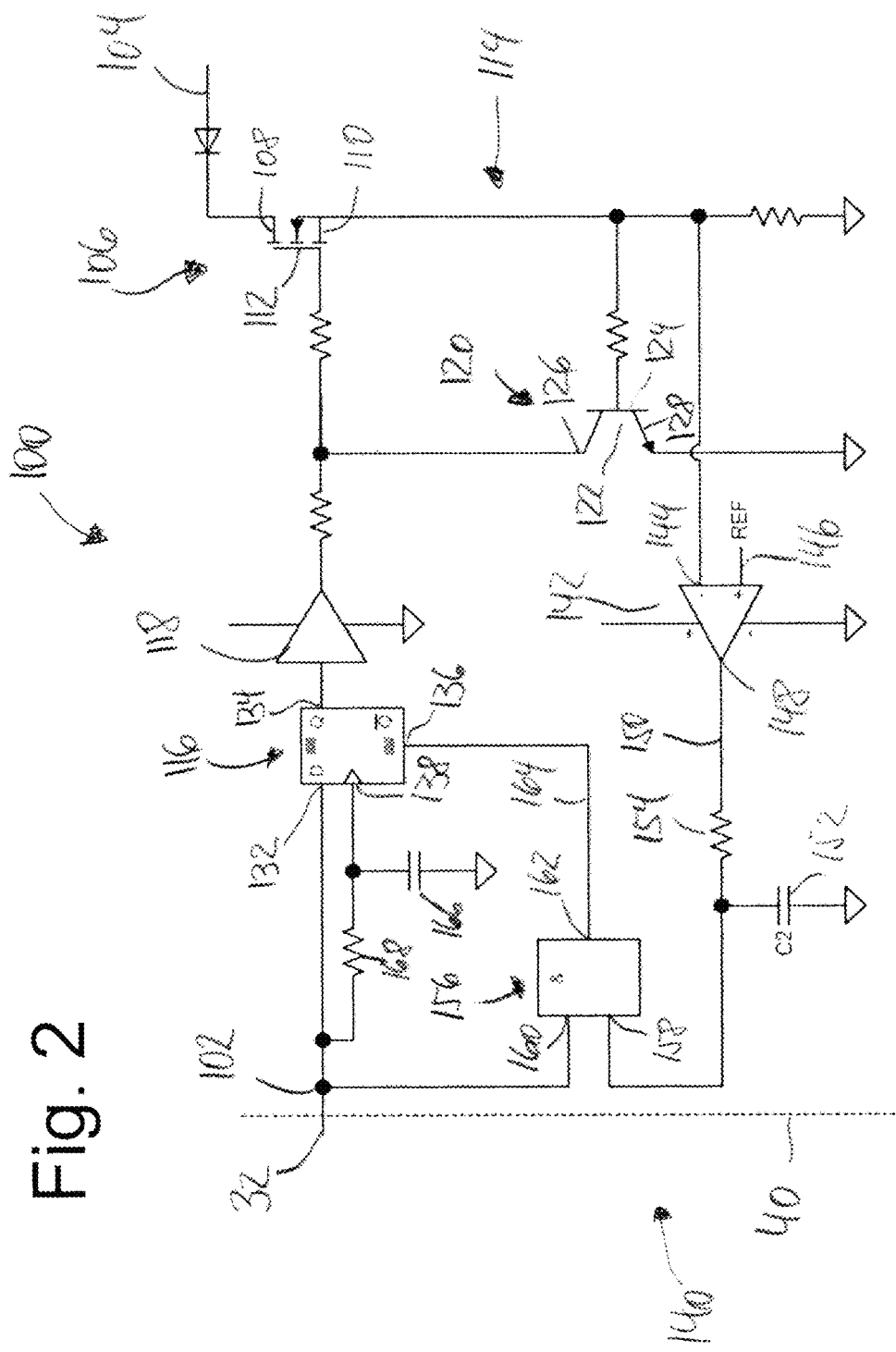
FIG. 2 illustrates a more detailed block diagram of the discrete output circuit of FIG. 1.

Embodiments described herein relate to a solid state power controller (SSPC), generally indicated by 10 in FIG. 1, comprising a discrete output circuit, generally indicated by 100 in FIGS. 1 and 2. The SSPC 10 is connected to a power feed line 12 connected at a left end 14 in FIG. 1 to a power source (not shown in FIG. 1). The power feed line 12 is connected at a right end 16 in FIG. 1 a load (not shown in FIG. 1). The SSPC 10 shown in FIG. 1 comprises one SSPC channel connected to the power feed line 12 and having an interface for connecting to the respective load. It is to be understood that in most cases the SSPC 10 may comprise a plurality of SSPC channels connected in parallel to the power feed line 12 with each SSPC channel having an interface for connecting to the respective load.

The SSPC 10 is configured to selectively connect a respective load to the power feed line 12 or to disconnect the respective load from the power feed line 12. In addition to the SSPC 10 at least one power conversion module (not shown) may be provided. The power conversion module is configured to convert electric power from the power feed line voltage to a specific load voltage required by the load. The at least one power conversion module may be connected in between the power feed line 12 and the SSPC 10.

SSPCs are used in power management and distribution systems to replace traditional electromechanical circuit breakers. The main function of an SSPC is to distribute power and to protect various electrical loads. In comparison to electromechanical devices, SSPCs provide a relatively fast response time, and may eliminate arcing during turn-off transient and bouncing during turn-on transient. SSPCs facilitate advanced protection and diagnostics, allowing for efficient power management and distribution architectures. SSPCs include power semiconductor devices that control power (voltage and/or current) supplied to a load. SSPCs perform supervisory and diagnostic functions in order to identify and prevent overload and short circuit conditions. Components of SSPCs may include power semiconductor switching devices, sensors to monitor output voltage and current and power semiconductor device temperature, and control circuitry. The control circuitry may include a microcontroller consisting of an arithmetic logic unit (ALU), memory, timer/counters, serial port, input/output (I/O) ports, and clock oscillator. Some SSPCs are programmable by a computer, user or by any proprietary method.

The feeder voltage may be any type of DC voltage or AC voltage and may have any voltage level. In aircraft power distribution systems, typical feeder DC voltages include 28 V DC or 270 V DC. Typical AC voltages include 115 or 200 V at 400 Hz.

As shown for the SSPC 10 of FIG. 1 which includes only one SSPC channel, each SSPC channel comprises a solid state switching device (SSSD) 18. The SSSD 18 comprises a first terminal 26 (e.g. drain D in case of a field effect transistor) connected to the power feed line 12 on a side of the least one load to be supplied with power from the power feed line 12, and a second terminal 24 (e.g. source S in case of a field effect transistor) connected to the power feed line 12 on a side of the power source. It is to be understood that the first and second terminals 26, 24 of the SSSD 18 may be connected to the power feed line 12 vice versa. The SSSD 18 further comprises a third terminal or control terminal 22 (gate G in case of a field effect transistor). The control terminal 22 is connected to an SSPC control circuit 20 via a control terminal driver 28 and a control terminal resistor 30. The SSPC control circuit 20 is configured to supply a control signal 32 at a control circuit output 34. The control signal 32 is supplied to the control terminal driver 28 which provides a control voltage to the control terminal 22 of the SSSD 18 for switching the SSSD 18 between an OFF condition (open state, i.e. a current path between the first and second terminals 26, 24 of the SSSD 18 is interrupted) and an ON condition (closed state, i.e. the current path between the first and second terminals 26, 24 of the SSSD 18 is electrically conductive). The SSSD 18 is configured to selectively connect the respective load to the power feed line 12 or to disconnect the respective load from the power feed line 12 depending on the control voltage supplied to the control terminal 22. The SSPC control circuit 20 may be configured to operate the SSSD 18 in a linear mode. When operating the SSSD 18 in a linear mode, in the ON condition of the SSSD 18, an electric resistance of the current path between the first and second terminals 26, 24 of the SSSD 18 varies depending on the control voltage supplied to the control terminal 22.

The SSPC 10 further comprises a discrete output circuit 100. The discrete output circuit 100 has a discrete input terminal 102 electrically connected to an output of the SSPC control circuit 20 which supplies the control signal for the control terminal 22 of the SSSD 18. However, as indicated schematically by a dashed line 40 in FIGS. 1 and 2 the discrete input terminal 102 is galvanically isolated from the SSPC control circuit 20 and from the control terminal 22 of the SSSD 18. Galvanic isolation may be achieved by any known components for connecting electric components in a galvanically isolated manner, e.g. by using opto-couplers, inductive coupling devices, capacitive coupling devices, or any circuits comprising such devices. Particularly the discrete input 102 of the discrete output circuit 100 may be connected to the SSPC control circuit 20 and the control terminal 22 of the SSSD 18 by a DC-DC converter providing galvanic isolation.

The discrete output circuit 100 further comprises a discrete output terminal 104. The discrete output terminal 104 provides a discrete output signal indicative of the state of the control terminal 22 of the SSSD 18. Particularly, the discrete output circuit 100 is configured to provide the discrete output signal at the discrete output terminal 104 in case the SSSD 18 is in the ON condition, i.e. switched to an open configuration in which power is supplied from the power source via the power feed line 12 to the load.

The discrete output signal delivered by the discrete output circuit 100 at the discrete output terminal 104 may be used for indicating the status of the SSPC or SSPC channel(s) controlled by the SSPC control circuit 20. For example, an LED or other optical indication device may be connected to the discrete output terminal 104. The discrete output terminal 104 may also be connected to a more complex electrical circuit supplying the discrete output signal to other devices or control circuits.

According to embodiments described herein the discrete output circuit 100 is configured to detect overcurrent (as used herein the term "overcurrent" is used to refer to any anomalous circuit condition, in particular to any form of overcurrent and/or overvoltage) in a circuit connected to the discrete output terminal 104. Moreover, the discrete output circuit 104 is configured to limit an output current and/or interrupt supply of the discrete output signal at the discrete output terminal 104 in case an overcurrent is detected. The discrete output circuit 100 is configured to provide these functions autonomously. No interaction is required between the discrete output circuit 100 and the SSPC 10 or SSPC control circuit 20, since the discrete output circuit 100 is configured to lock itself autonomously in case of overcurrent. Detection of overcurrent and limiting an output current and/or interruption of supply of the discrete output signal at the discrete output terminal is provided independent of the control voltage supplied to the control terminal 22 of the SSSD 18. Moreover, limiting an output current and/or interruption of supply of the discrete output signal at the discrete output terminal 104 does not affect the control voltage supplied to the control terminal 22 of the SSSD 18.

The discrete output circuit 100 receives the control signal 32 supplied by the SSPC control circuit 20 for adjusting the control voltage to the control terminal 22 of the SSSD 18. Thus, supply of the discrete output signal at the discrete output terminal 104 is triggered by the SSPC or SSPC control circuit 20 when the SSSD 18 is switched from an open state in which the load is disconnected from the power feed line 12 (OFF condition) to a closed state in which the load is connected to the power feed line 12 (ON condition). Upon receipt of a signal indicating that the SSSD 18 is switched from an open state (OFF condition) to a closed state (ON condition), the discrete output circuit 100 is configured to switch itself to ON, i.e to supply the discrete output signal at the discrete output terminal 104. The discrete output circuit 100 is also configured to lock itself in case an overcurrent is detected in the discrete output supplying circuit. Once having locked itself, the discrete output circuit 100 limits an output current and/or terminates supplying the discrete output signal at the discrete output terminal 104. This occurs irrespective whether the SSSD 18 remains in a closed state (ON condition) or switches to the open state (OFF condition). After having stopped supplying the discrete output signal because of an overcurrent, the discrete output circuit 100 may be triggered by the SSPC control circuit 20 to again supply the discrete output signal in case it receives a subsequent control signal 32 from the SSPC control circuit 20 over the galvanically isolated connection 40 indicating that the SSSD 18 is switched from the open state (OFF condition) to a closed state (ON condition) again.

The self locking capability of the discrete output circuit 100 allows to avoid exchange of signals between the discrete output circuit 100 and the SSPC 10 or SSPC control circuit 20. Only one trigger signal is required for triggering the discrete output circuit 100 to supply the discrete output signal at the discrete output terminal when the SSSD 18 is switched from the open state (OFF condition) to a closed state (ON condition). This reduces consumption of circuit board space, since multiple exchange of signals over the galvanically isolated connection is not required.

A galvanically isolated electrical connection between the SSPC control circuit 20 and/or the control terminal 22 of the SSSD 18 and the discrete input terminal 102 may be realized by any known techniques, e.g. using opto-couplers, inductive coupling devices, capacitive coupling devices, or any other coupling circuits like DC-DC converters.

The discrete output circuit 100 further comprises a discrete output switch 106 connected to the discrete output terminal 104 and configured to supply the discrete output signal at the discrete output terminal 104 when switched to a closed state. The discrete output switch 106 comprises a first terminal 108 (e.g. drain D in case of a field effect transistor) connected to a discrete output signal supplying circuit 114 on a side of the discrete output terminal 104, and a second terminal 110 (e.g. source S in case of a field effect transistor) connected to the discrete output signal supplying circuit 114 on an opposite side connected to ground. It is to be understood that the first and second terminals 108, 110 of the discrete output switch 106 may be connected to the discrete output signal supplying circuit 114 vice versa. The discrete output switch 106 further comprises a third terminal or control terminal 112 (gate G in case of a field effect transistor). According to a control voltage applied to the control terminal 112, a current path between the first and second terminals 108, 110 of the discrete output switch 106 will be conductive (ON condition) or non-conductive/isolating (OFF-condition). For sake of simplicity, the current path between the first and second terminals 108, 112 of the discrete output switch 106 will be referred to as drain-source path of the discrete output switch 106.

The control terminal 112 is connected to the discrete input terminal 102 of the discrete output circuit 100 via a latch circuit 116 and a control terminal driver 118. The control terminal 112 of the discrete output switch 106 thus receives from the discrete input terminal 102 a trigger signal for supplying the discrete output signal at the discrete output terminal 104. The signal 32 supplied to the discrete input terminal 102 triggers the latch circuit 116 such that the latch circuit 116 provides the control signal for switching the discrete output switch 106 into an ON condition, as described in more detail below.

The discrete output switch 106 may be a solid state switching device, in particular a transistor like an IGBT or a field effect transistor like a MOSFET or a JFET. In case of a field effect transistor, the control terminal 112 of the discrete output switch 106 is referred to as a gate terminal, and the discrete output signal is supplied in a drain-source circuit of the field effect transistor in case the field effect transistor is switched to an ON condition (i.e. the drain-source path is electrically conductive) by applying a corresponding control voltage to the gate terminal 112. In a particular embodiment the discrete output switch 106 is operated in a linear mode when switched to the ON condition, i.e. the output resistance in the drain-source path of the discrete output switch 106 depends on the control voltage supplied to the control terminal 112 of the discrete output switch 106.

Further, the discrete output circuit 100 comprise a first overcurrent limiting 120 configured to increase an output resistance provided by the discrete output switch 106 at the discrete output terminal 104 according to an increase of an output current in a circuit connected to the discrete output terminal 104 of the discrete output circuit 100 (also referred to as a discrete output signal supplying circuit). The first overcurrent limiting 120 comprises a feedback loop configured to feed back a signal indicative of the output current to the control terminal 112 of the discrete output switch 106. The feedback loop is configured such that an increase in the output current will lead to an increase of an output resistance provided by the drain-source path of the discrete output switch 106 at the discrete output terminal 104 after activation of the feedback loop.

When operated in the linear mode the discrete output switch 106 provides an output resistance in its drain-source path which depends on the control voltage supplied to the control terminal 112 of the discrete output switch 106. As one example, in case the discrete output switch 106 is a field effect transistor, when operated in a linear mode the output resistance of the drain-source path will depend on the control voltage supplied to the gate terminal 112. In particular, the lower the control voltage supplied to the gate terminal 112, the higher will be the output resistance in the drain-source path. Analog considerations apply in case the discrete output switch 106 is a transistor. The feedback loop of the first overcurrent limiting 120, after activation, may thus affect the control voltage supplied to the control terminal 112 of the discrete output switch 106 in such a way that an increase in the output current in the discrete output signal supplying circuit 114 causes a decrease in the control voltage supplied to the control terminal 112 of the discrete output switch 106, thus increasing the output resistance of the discrete output circuit 100.

As shown in FIG. 2, the first overcurrent limiting 120 may comprise a current stabilizing transistor 122 having a base 124 connected to the discrete output signal supplying circuit 114, a collector 126 connected to the control terminal 112 of the discrete output switch 106, and an emitter 128 connected to ground. The feedback loop comprises the current stabilizing transistor 122 which is connected in such a manner that a base-emitter voltage of the current stabilizing transistor 122 increases with increasing output current in the discrete output signal supplying circuit 114. Once the base-emitter voltage increases to a threshold voltage or above, the current stabilizing transistor becomes conductive. This activates the feedback loop of the first overcurrent limiting circuit 120. In the activated state, the output current in the discrete output signal supplying circuit 114 causes a base-emitter current in the current stabilizing transistor 122. The base-emitter current leads to an amplified current in the collector-emitter circuit of the current stabilizing transistor 122. Thereby, an increase in output current in the discrete output signal supplying circuit 114 will cause a decreasing electric resistance in the collector-emitter circuit of the current stabilizing transistor 122. In this way the current stabilizing transistor 122 causes a reduction of the control voltage supplied to the control terminal 112 of the discrete output switch 106 in reaction to an increase in the output current flowing in the discrete output signal supplying circuit 114. As the discrete output switch 106 is operated in a linear mode (e.g. in the form of a MOSFET or FET operated in linear mode), output resistance of the drain-source path of the discrete output switch 106 will increase in accordance with decrease in the control voltage supplied to the control terminal 112 of the discrete output switch 106. Increased output resistance will reduce the output current in the discrete output signal supplying circuit 114. Thus, once the output current in the discrete output limiting circuit 114 reaches a predefined feedback loop activation threshold, the feedback loop of the first overcurrent limiting circuit 120 is activated and stabilizes the output current in the discrete output signal supplying circuit 114.

The latch circuit 116 connected in between the discrete input terminal 102 and the control terminal 112 of the discrete output switch 106 may have any configuration known in the art. Particularly, when a triggering signal 32 is provided to an input terminal 132 of the latch circuit 116, the latch circuit 116 will switch an output terminal 134 thereof to HIGH and provide the HIGH signal at the output terminal 134, until a reset signal is received at a reset terminal 136 of the latch circuit 116. Connecting the input terminal 132 of the latch circuit 116 to the discrete input terminal 102 allows to switch the latch circuit 116 to HIGH and provide a signal indicating the HIGH condition at the output terminal 134 of the latch circuit 116. The output terminal 134 of the latch circuit 116 is connected to the control terminal 112 of the discrete output switch 106 via a control terminal driver 118 connected in between the output terminal 134 of the latch circuit 116 and the control terminal 112 of the discrete output switch 106. The control terminal driver 118 has the configuration of an operating amplifier providing a suitable control voltage for switching the discrete output switch 106 from an open state to a closed state, if desired to a closed state in which the discrete output switch 106 operates in a linear mode.

Further, the discrete output circuit 100 comprises a second overcurrent limitation circuit 140 configured to detect an overcurrent in a circuit 114 connected to the discrete output terminal 104 (also referred to as an discrete output signal supplying circuit 114), ie. any anomalous situations being detectable as an overcurrent and/or an overvoltage in the circuit 114. Overcurrent/overvoltage refers to a current/voltage exceeding a predefined threshold level.

The overcurrent detection circuit 140 comprises a comparator 142 having a first input 144 receiving a signal according to a current and/or voltage in the circuit 114 connected to the discrete output terminal 104, and a second input terminal 146 supplied by a reference signal. The reference signal indicates a predefined overcurrent detection threshold value. In case the current and/or voltage measured in the circuit 114 connected to the discrete output terminal 104 exceeds the overcurrent detection threshold value, the comparator 142 detects an overcurrent condition and supplies a comparator overcurrent signal 150 at an output 148 thereof.

The overcurrent detection circuit 140 further comprises an AND logic 156 having a first input 158 connected to the output 148 of the comparator 142, a second input 160 connected to the discrete input terminal 102, and an output 162 connected to the reset input 136 of the latch circuit 116.

The AND logic 156 provides an AND logic overcurrent signal 164 at its output 164 in case it receives a comparator overcurrent signal 150 from the comparator 142 at its first input 158 and a control signal 32 corresponding to an ON condition of the SSSD 18 of the SSPC 10 at its second input terminal 160. As the output 162 of the AND logic 156 is connected to the reset input 136 of the latch circuit 116, the latch circuit 116 is reset (cleared) in case the AND logic 156 provides the AND logic overcurrent signal 164 at its output 162. Resetting (clearing) the latch circuit 116 will set the output terminal 134 of the latch circuit 116 to LOW and thereby switch the discrete output switch 106 to the OFF condition (in which the source drain path of the discrete output switch 106 is electrically isolated). Once the discrete output switch 106 is switched to the OFF condition the discrete output signal is no longer supplied at the discrete output terminal 104.

The second overcurrent limiting circuit 140 further may comprise a first RC member 152, 154 connected in between the output 148 of the comparator 142 and the first input 158 of the AND logic 156. The first RC 152, 154 member may delay supply of the comparator overcurrent signal from the comparator output 148 to the first input 158 of the AND logic 156. Thus, activation of the second current limiting circuit by resetting (clearing) of the latch circuit 116 may be delayed with respect to detection of an overcurrent by the comparator 142 for a predefined time which can be adjusted by choice of the capacity and resistance of the first RC member 152, 154. During a time after activation of the feedback loop of the first current limiting circuit 120 and before lapse of the delay time adjusted by the first RC member 152, 154, only the first overcurrent limiting circuit 120 will be activated. During this time the first overcurrent limiting circuit 120 will cause operation of the discrete output switch 106 in a linear operation mode and stabilization of a current in discrete output signal supplying circuit 114 to a predefined current value. After lapse of the delay time, the second overcurrent detection circuit 140 will be activated and cause resetting (clearing) the latch circuit 116 to set the output terminal 134 of the latch circuit 116 to LOW and thereby switch the discrete output switch 106 to the OFF condition. Once the discrete output switch 106 is switched to the OFF condition the discrete output signal is no longer supplied at the discrete output terminal 104.

Further, the discrete output circuit 100 may comprise a second RC member 166, 168 connected in between the discrete input terminal 102 and an enable/CLK input 138 of the latch circuit 116. The second RC member 166, 168 may supply of a CLK signal to the latch circuit 116 to ensure that the control voltage supplied to the first input terminal 132 of the latch circuit 116 is already present for some time (typically a few microseconds) when supplying the CLK signal to the enable/CLK input 138 to change the state of the latch circuit 116 from OFF to ON.

While the invention has been described with reference to exemplary embodiments, it will be understood by those skilled in the art that various changes may be made and equivalents may be substituted for elements thereof without departing from the scope of the invention. In addition, many modifications may be made to adopt a particular situation or material to the teachings of the invention without departing from the essential scope thereof. Therefore, it is intended that the invention is not limited to the particular embodiments disclosed, but that the invention includes all embodiments falling within the scope of the claims.

The invention claimed is:

1. A solid state power controller, comprising:
    at least one solid state switching device connected to at least one load to be supplied with power from a power feed line and configured to selectively connect the respective load to the power feed line or to disconnect the respective load from the power feed line;
    at least one SSPC control circuit configured to supply a control voltage to a control terminal of the solid state switching device; and
    a discrete output circuit electrically connected to, and galvanically isolated from, the SSPC control circuit and/or the control terminal of the solid state switching device;
    wherein the discrete output circuit comprises a discrete output terminal and is configured to supply at the discrete output terminal a discrete output signal indicative of the state of the control terminal of the solid state switching device,
    wherein the discrete output circuit is configured to detect an overcurrent in a circuit connected to the discrete output terminal and to limit an output current and interrupt supply of the discrete output signal in case an overcurrent is detected,
    wherein the discrete output circuit comprises a discrete input terminal connected in a galvanically isolated manner to a control terminal output of the SSPC control circuit, and
    wherein the discrete output circuit comprises a discrete output switch connected to the discrete output terminal, the discrete output switch being configured to supply the discrete output signal at the discrete output terminal when switched to a closed state.

2. The solid state power controller according to claim 1, wherein the discrete output switch has a discrete output switch control terminal connected to the discrete input terminal of the discrete output circuit.

3. The solid state power controller according to claim 1, wherein the discrete output switch is a solid state switching device, in particular a MOSFET or a FET.

4. The solid state power controller according to claim 2, wherein the discrete output circuit comprises a first overcurrent limiting circuit configured to reduce a control voltage applied to the control terminal of the discrete output switch such as to increase an output resistance provided at the discrete output terminal according to an increase of an output current in a circuit connected to the discrete output terminal of the discrete output circuit.

5. The solid state power controller according to claim 4, wherein the first overcurrent limiting circuit is configured to operate the discrete output switch in a linear mode in case of a first overcurrent.

6. The solid state power controller according to claim 4, wherein the first overcurrent limiting circuit comprises a current stabilizing transistor having a base receiving a signal according to an output current in a circuit connected to the discrete output terminal of the discrete output circuit, a collector connected to the control terminal of the discrete output switch, and an emitter connected to ground.

7. The solid state power controller according to claim 1, wherein the discrete output circuit includes a latch circuit connected in between the discrete input terminal and the control terminal of the discrete output switch.

8. The solid state power controller according to claim 7, wherein the discrete output circuit comprises a control terminal driver connected in between an output of the latch circuit and the control terminal of the discrete output switch.

9. The solid state power controller according to claim 8, wherein the discrete output circuit comprises a second overcurrent limiting circuit configured to detect an overcurrent in a circuit connected to the discrete output terminal.

10. The solid state power controller according to claim 9, wherein the second overcurrent limiting circuit comprises a comparator having a first input receiving a signal according to an output current in a circuit connected to the discrete output terminal, and a second terminal supplied by a reference signal.

11. The solid state power controller according to claim 10, wherein the second overcurrent limiting circuit comprises an AND logic having a first input connected to the output of the comparator, a second input connected to the discrete input terminal, and an output connected to a reset input of the latch circuit.

12. The solid state power controller, according to claim 11, wherein the second overcurrent limiting circuit comprises a first RC member connected in between the output of the comparator and the first input of the AND logic.

13. The solid state power controller according to claim 12, wherein the discrete output circuit comprises a second RC member connected in between the discrete input terminal and an enable/CLK input of the latch circuit.

* * * * *